United States Patent
Kawamura

(10) Patent No.: US 7,161,355 B1
(45) Date of Patent: Jan. 9, 2007

(54) VOLTAGE DETECTION DEVICE AND INSULATION DETECTING APPARATUS FOR NON-GROUNDED POWER SUPPLY INCLUDING THE VOLTAGE DETECTION DEVICE

(75) Inventor: Yoshihiro Kawamura, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 30 days.

(21) Appl. No.: 11/170,140

(22) Filed: Jun. 30, 2005

(51) Int. Cl.
*G01R 31/08* (2006.01)

(52) U.S. Cl. ...................... 324/522; 324/544

(58) Field of Classification Search ............ 324/522, 324/544
See application file for complete search history.

(56) References Cited

U.S. PATENT DOCUMENTS 6,008,664 A * 12/1999 Jett et al. ................ 324/765
6,786,639 B1 * 9/2004 Covi et al. ............... 374/178
6,888,354 B1 * 5/2005 Gofman .................... 324/427

* cited by examiner

*Primary Examiner*—Walter Benson
(74) *Attorney, Agent, or Firm*—Sughrue Mion, PLLC

(57) ABSTRACT

A voltage detection device includes a processor that has a first input port, and a second input port grounded at a first ground potential part, a first Schottky barrier diode that has a cathode connected to a junction of an electric wire between the first input port and a voltage detection object part, and an anode grounded at a second ground potential part, and a second Schottky barrier diode that has an anode connected to a junction of an electric wire between the second input port and a third ground potential part, and a cathode connected to a positive terminal of a power supply. When the processor detects a voltage at the voltage detection object part, the processor detects a value obtained by adding a voltage applied to the second input port to a voltage applied to the first input port as the voltage.

4 Claims, 4 Drawing Sheets

VOLTAGE DETECTION DEVICE AND INSULATION DETECTING APPARATUS FOR NON-GROUNDED POWER SUPPLY INCLUDING THE VOLTAGE DETECTION DEVICE

BACKGROUND OF THE INVENTION

The present invention relates to a voltage detection device and an insulation detecting apparatus for a non-grounded power supply includiing the voltage detection device and, more particularly, to a voltage detection device for detecting a voltage using a microcomputer and an insulation detecting apparatus for a non-grounded power supply including the voltage detection device.

A voltage detection circuit for detecting a voltage using a microcomputer is equipped with a clamping diode for preventing the application of an excessive positive or negative voltage which can damage the microcomputer to an input port of the microcomputer to which a part subjected to voltage detection is connected. A rectifier diode may be used as the clamping diode to prevent the application of an excessive positive or negative voltage to the input port of the microcomputer for a relatively short time. However, in order to prevent the application of an excessive positive or negative voltage to the input port of the microcomputer for a relatively long time, a Schottky barrier diode, which has a smaller forward voltage drop, is used to reduce stress on the microcomputer.

However, since a Schottky barrier diode has a character that a leakage current at the same becomes greater as the ambient temperature increases, a voltage drop or voltage loss through the Schottky barrier diode increases with the ambient temperature. For this reason, a voltage detection circuit having a Schottky barrier diode has a problem in the accuracy of a detection voltage detected at an input port of a microcomputer.

Under the circumstance, one approach for the improvement of the accuracy of the detection voltage is to correct the detection voltage through detection of the ambient temperature which is achieved by connecting a thermistor to an input port of the microcomputer different from the input port connected to the part under voltage detection. In this case, in addition to connecting the thermistor to the input port of the microcomputer different from the input port connected to the part under voltage detection, data associated with a relationship between the ambient temperature and a leakage current at the Schottky barrier diode are input in advance to the microcomputer. The microcomputer calculates the ambient temperature from a voltage detected at the input port connected with the thermistor and converts the calculated ambient temperature into a leakage voltage using the data associated with a relationship between the ambient temperature and a leakage current. Further, the value of any voltage loss is identified based on the converted leakage current to correct the voltage detected at the input port of the microcomputer connected to the part under voltage detection using the value of the voltage loss thus identified.

In such a voltage detection circuit, the ambient temperature is calculated using the thermistor; conversion is performed to find any leakage current at the Schottky barrier diode based on a theoretical relationship between the ambient temperature and a leakage current; and a loss is identified based on the leakage current identified as a result of the conversion. However, the characteristics of a Schottky barrier diode do not necessarily agree with specifications shown on the data book and may include variations. Therefore, the calculation and conversion are repeated with a possibility of an error, and an error between a calculated value of a voltage loss and the actual value of the voltage loss can increase each time a calculation or conversion is repeated. For this reason, in such a voltage detection circuit using a thermistor, it is difficult to improve the accuracy of a detection voltage detected at the input terminal of the microcomputer.

As an apparatus having such a voltage detection circuit, the inventors conceived an insulation detector including: a first switching unit which connects a capacitor to a DC power supply whose wirings at a positive terminal side and a negative terminal side thereof are insulated from a part at ground potential, the capacitor being connected in series for a first preset time, a second switching unit which connects the capacitor between the positive terminal of the power supply and the part at ground potential, the capacitor being connected in series for a second preset time, a third switching unit which connects the capacitor between the part at ground potential and the negative terminal of the power supply, the capacitor being connected in series for the second preset time, a fourth switching unit which connects a voltage detection circuit for detecting a voltage across terminals of the capacitor after each of the first, second, and a third switching unit is unmade, and a calculation unit which estimates a power supply voltage of the power supply based on the voltage detected by the voltage detection circuit after the first switching unit is unmade and finding an insulation resistance of the power supply to the part at ground potential based on the estimated power supply voltage of the power supply and each of the voltages detected by the voltage detection circuit when the second and third switching unit are unmade.

In such an insulation detector, the first preset time is set shorter than the time required for fully charging the capacitor; the capacitor is charged for the first preset time by connecting it between the DC power supply and the part at ground potential in series with the first switching unit; and the voltage across the terminals at both ends of the capacitor at this time is detected by the voltage detection circuit connected by the fourth switching unit. The calculation section can estimate the power supply voltage from the detected voltage using an equation for calculating the power supply voltage including the capacity of the capacitor as a constant. The insulation resistance is calculated based on the estimated power supply voltage and the voltages detected by the detection unit after the second and third switching unit are unmade using an equation for calculating the insulation resistance including the capacity of the capacitor as a constant, which makes it possible to reduce an error in the measurement of the insulation resistance and to thereby improve the accuracy of detection of the state of insulation.

When a microcomputer is used in the voltage detection circuit of such an insulation detector, negative potential can be applied to an input port of the microcomputer for detecting the voltage across the capacitor as a result of opening and closing of the switching unit. For this reason a Schottky barrier diode is used as a diode for clamping the negative potential. However, since a voltage detected by the voltage detection circuit is used for the calculation of an insulation resistance in such an insulation detector, when the accuracy of the voltage detected by the voltage detection circuit is questionable, a problem arises in that accuracy cannot be improved in detecting the state of insulation. Under the circumstance, there are demands for an improvement of the detecting accuracy of the state of insulation through an improvement in the accuracy of a voltage detected by a voltage detection circuit.

SUMMARY OF THE INVENTION

It is a first object of the invention to improve the accuracy of a detection voltage.

It is a second object of the invention to improve the accuracy of a voltage detected by a voltage detection circuit to achieve a further improvement in the detecting accuracy of the state of insulation.

In order to achieve the above objects, according to the present invention, there is provided a voltage detection device, comprising:

a processor that has a first input port for connecting to a voltage detection object part, and a second input port grounded at a first ground potential part;

a first Schottky barrier diode that has a cathode connected to a junction of an electric wire between the first input port and the voltage detection object part, and an anode grounded at a second ground potential part; and a second Schottky barrier diode that has an anode connected to a junction of an electric wire between the second input port and a third ground potential part, and a cathode connected to a positive terminal of a power supply, the second Schottky barrier diode being identical to the first Schottky barrier diode in the leakage current standard, wherein when the processor detects a voltage at the voltage detection object part, the processor detects a value obtained by adding a voltage applied to the second input port to a voltage applied to the first input port as the voltage.

In such a configuration, the first Schottky barrier diode used for clamping and the second Schottky barrier diode used for correction are Schottky barrier diodes according to the same leakage current standard. Thus, a voltage substantially equal to a voltage loss attributable to a leakage current at the first Schottky barrier diode for clamping is applied to the second input port of the microcomputer to which the second Schottky barrier diode for correction is connected. It is therefore possible to obtain a detection voltage which has been corrected for any voltage loss attributable to the first Schottky barrier diode for clamping by adding the voltage applied to the second input port of the microcomputer to the voltage applied to the first input port. Since the correction of a detection voltage does not involve any calculation and conversion that can introduce an error as thus described, the accuracy of a detection voltage can be improved.

Preferably, the voltage detection device further comprises:

a first resistor that is provided between the first input port and the voltage detection object part; and a second resistor that is provided between the second input port and the third ground potential part. A resistance value of the first resistor is the same as that of the second resistor.

Such a configuration makes it possible to improve the accuracy of a detection voltage even when there is provided a resistor which is connected to the first input port of the microcomputer at one terminal thereof and connected to the part under voltage detection at another terminal thereof.

According to the present invention, there is also provided an insulation detecting apparatus for a non-grounded power supply, comprising:

a first switching unit that connects a capacitor to a DC power supply in series for a first preset time, the DC power supply having wirings at a positive terminal side and a negative terminal side which are insulated from a ground potential part;

a second switching unit that connects the capacitor so as to be arranged between the positive terminal of the power supply and the ground potential part in series for a second preset time;

a third switching unit that connects the capacitor so as to be arranged between the ground potential part and the negative terminal of the power supply in series for the second preset time;

a voltage detection device that detects a voltage across terminals of the capacitor;

a fourth switching unit that connects the voltage detection device so as to detect the voltage after the first, second, and third switching units are shut off; and a calculation unit that estimates a power supply voltage of the power supply based on the voltage detected by the voltage detection device in a state that the first switching unit is shut off, and that calculates an insulation resistance of the power supply with respect to the ground potential part based on the estimated power supply voltage of the power supply and each of the voltages detected by the voltage detection device after the second switching unit is shut off and the third switching unit is shut off respectively;

wherein the voltage detection device includes:

a processor that has a first input port for connecting to a voltage detection object part, and a second input port grounded at a first ground potential part;

a first Schottky barrier diode that has a cathode connected to a junction of an electric wire between the first input port and the voltage detection object part, and an anode grounded at a second ground potential part; and a second Schottky barrier diode that has an anode connected to a junction of an electric wire between the second input port and a third ground potential part, and a cathode connected to a positive terminal of a power supply, the second Schottky barrier diode is identical to the first Schottky barrier diode in the leakage current standard.

wherein when the processor detects a voltage at the voltage detection object part, the processor detects a value obtained by adding a voltage applied to the second input port to a voltage applied to the first input port as the voltage.

In such a configuration, since the correction of a detection voltage does not involve any calculation and conversion that can introduce an error as thus described, the accuracy of a detection voltage can be improved. It is therefore possible to improve the accuracy of a voltage detected by the voltage detection device and to thereby further improve the accuracy in detecting the state of insulation.

Preferably, the voltage detection device includes: a first resistor that is provided between the first input port and the voltage detection object part, and a second resistor that is provided between the second input port and the third ground potential part. A resistance value of the first resistor is the same as that of the second resistor.

A device configuration may be employed in which the first switching unit includes a first switch section connected to a positive terminal of the power supply and a second switch section connected to a negative terminal of the power supply; the third switching unit includes the first switch section and a third switch section connected in series to the first switch; the second switching unit includes the first switch section and a fourth switch section connected in series to the second switch section; a first diode and a capacitor are connected in series between the second switch section and the fourth switch section, the first diode rectifying a current in the direction from the positive side to the negative side; a second diode is connected in parallel with the first diode for rectification in the direction opposite to that of the first diode; the voltage detection device is connected to the part under voltage detection which is located between the third switch section and the fourth switch section; a connection to the part at ground potential is provided between the part under voltage detection and the fourth switch section.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
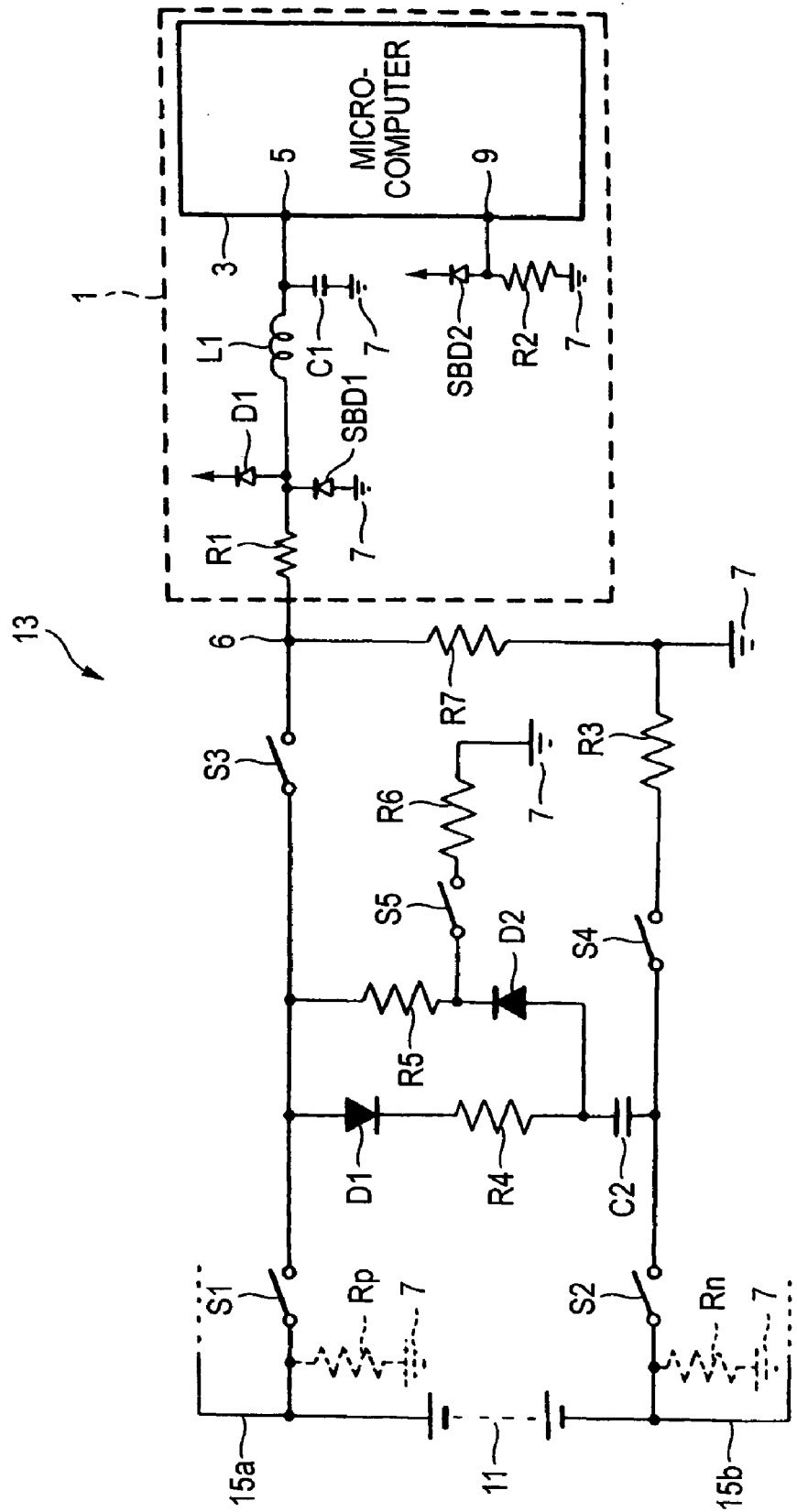
FIG. 1 is a diagram showing a schematic configuration of an embodiment of a voltage detection circuit employing the invention and an insulation detector having the voltage detection circuit.
Figure 2:
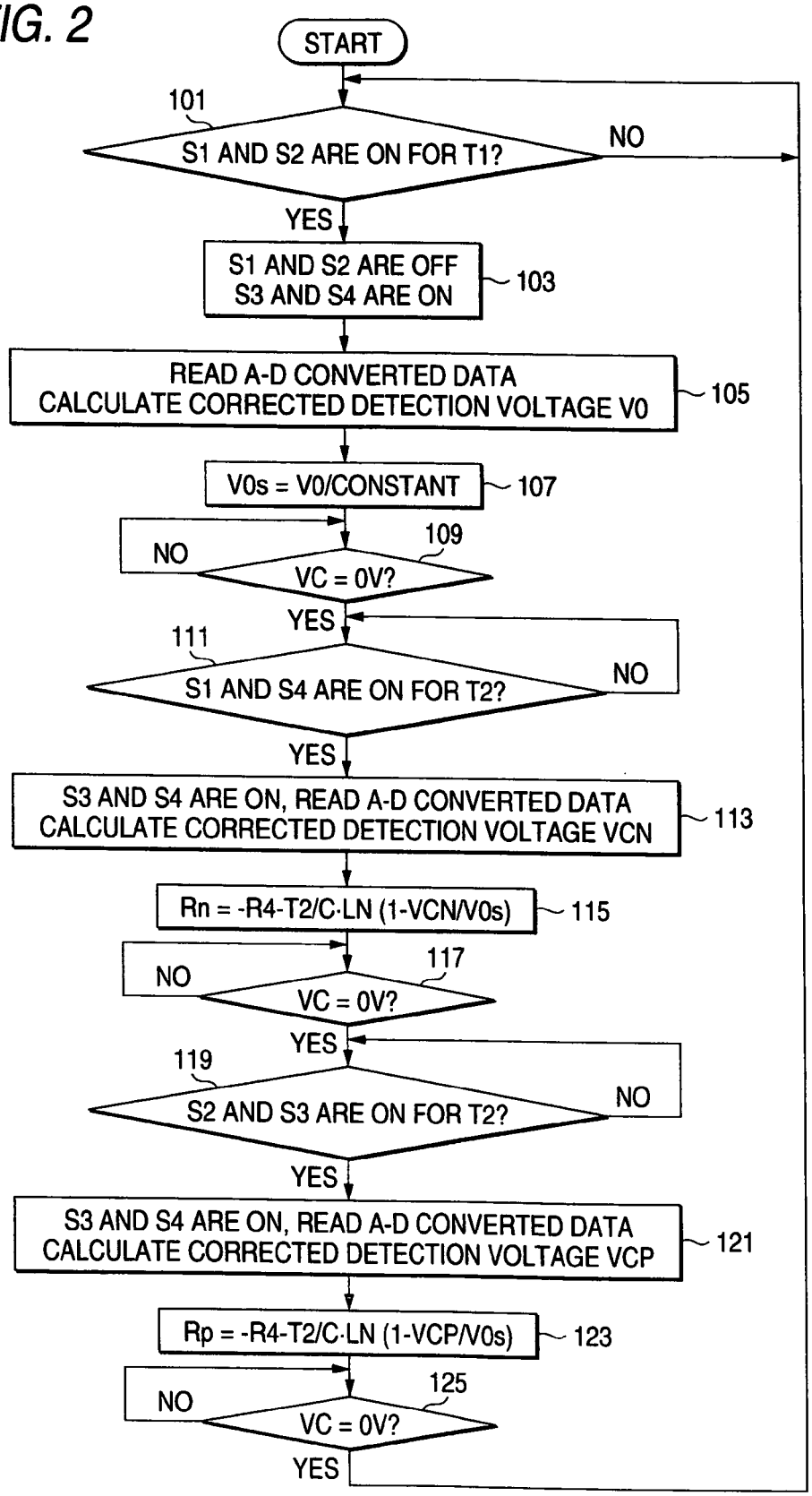
FIG. 2 is a flow chart showing an operation of calculating an insulation resistance in the embodiment of the insulation detector having the voltage detection circuit employing the invention.
Figure 3:
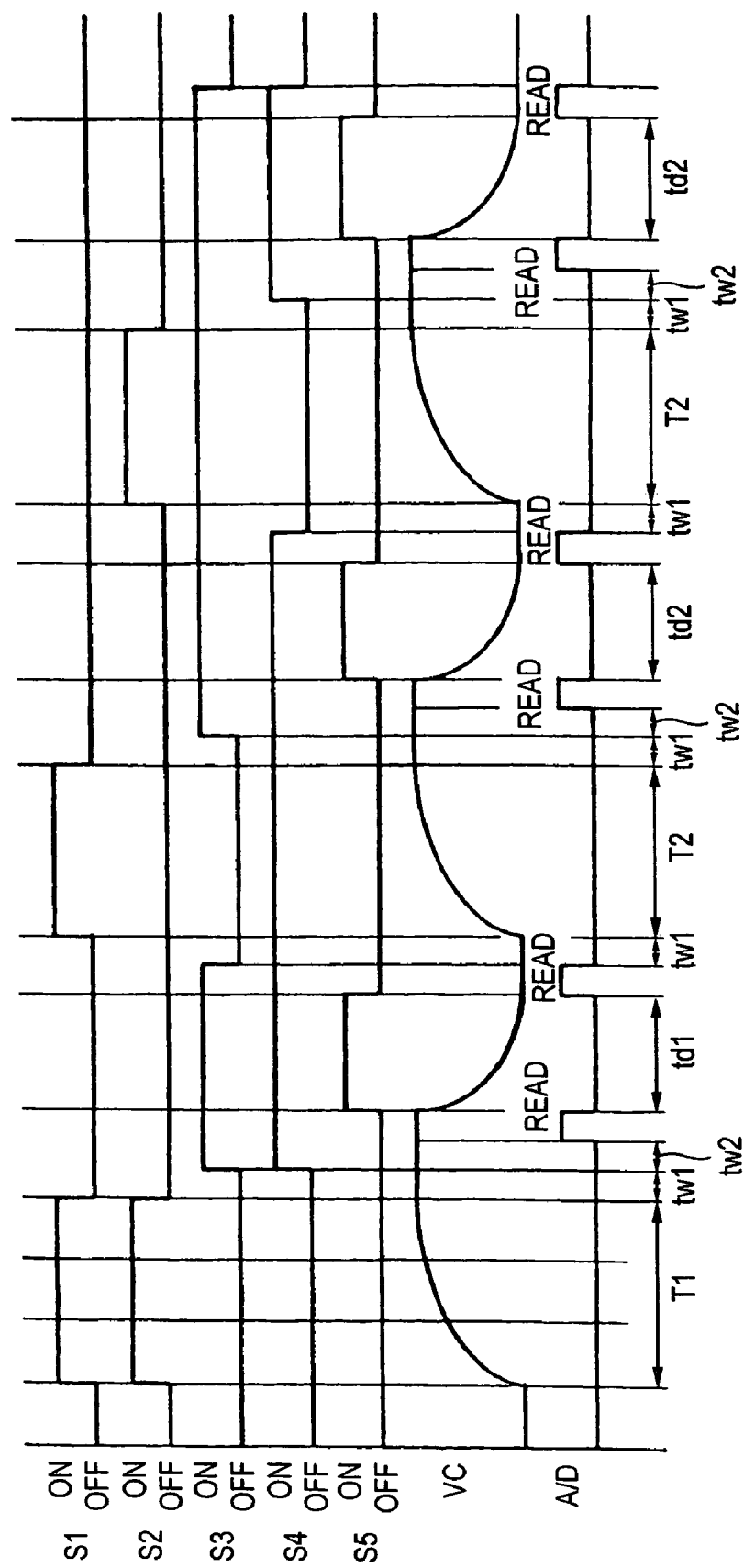
FIG. 3 is a time chart showing states of charging and discharging of a capacitor in response to operations of switch sections of the insulation detector having the voltage detection circuit employing the invention and timing for voltage reading.
Figure 4:
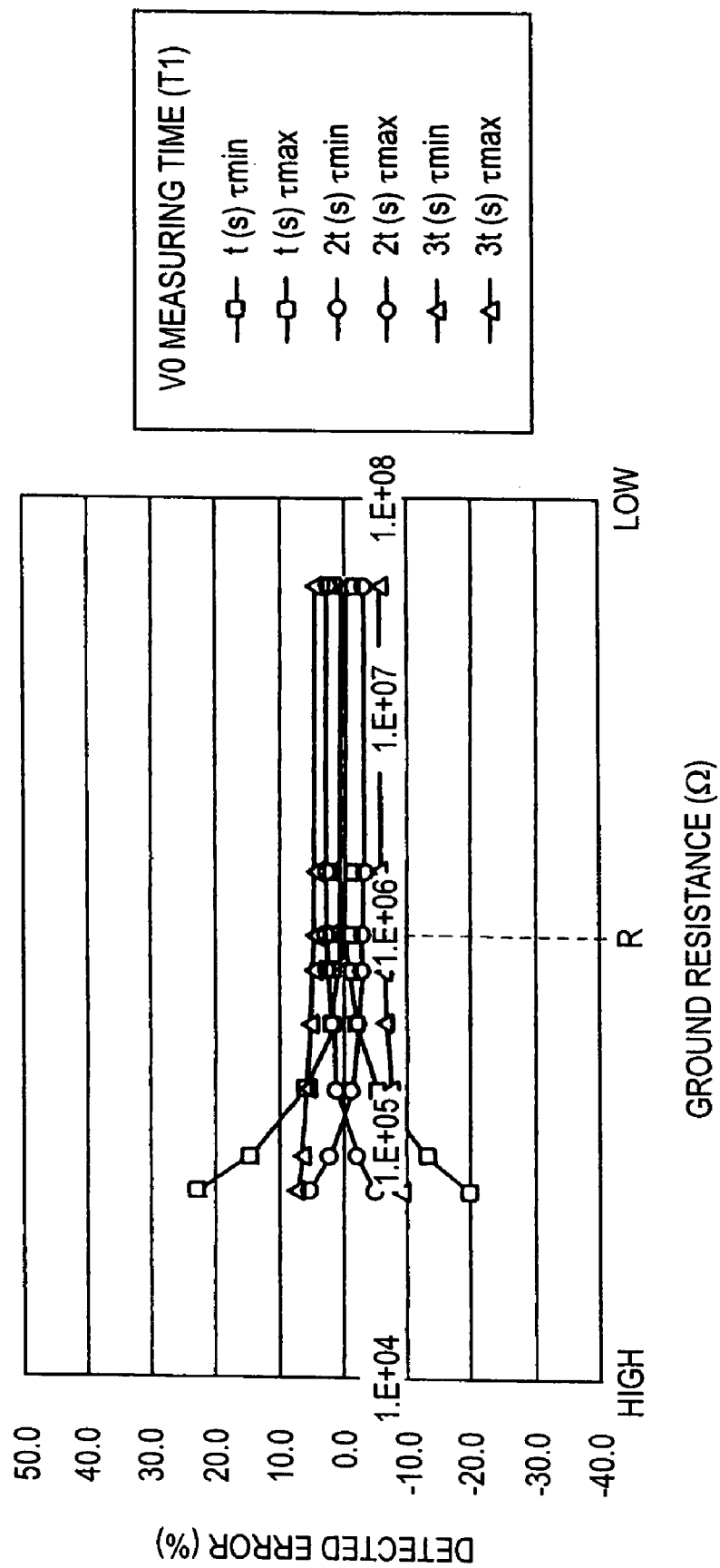
FIG. 4 is a graph showing errors in detection of insulation resistance values detected during power supply voltage measuring times associated with the insulation resistance values.

An embodiment of a voltage detection circuit employing the invention and an insulation detector having the voltage detection circuit will now be described with reference to FIGS. 1 to 4. FIG. 1 shows a schematic configuration of the voltage detection circuit employing the invention and the insulation detector having the voltage detection circuit. FIG. 2 is a flow chart showing an operation of calculating an insulation resistance performed by the insulation detector having the voltage detection circuit employing the invention. FIG. 3 is a time chart showing states of charging and discharging of a capacitor in response to operations of switch sections and timing for voltage reading. FIG. 4 shows errors in detection of insulation resistance values detected during power supply voltage measuring times associated with the insulation resistance values.

As shown in FIG. 1, a voltage detection circuit 1 of the present embodiment includes a microcomputer 3. A part 6 to be voltage detected is connected to a first analog-to-digital conversion input port, that is, a first A-D input port 5 of the microcomputer 3. A first resistor R1 and a coil L, which are listed in their closeness to the voltage detection object part 6, are connected in series between the voltage detection object part 6 and the first A-D input port 5 of the microcomputer 3.

In order to prevent an excessive negative potential from being applied to the first A-D input port 5 of the microcomputer 3, a cathode of a first Schottky barrier diode SBD1 for clamping is connected to the part between the coil L1 and the first resistor R1 closer to the first resistor R1. In order to prevent an excessive positive potential from being applied o the first A-D input port 5 of the microcomputer 3, an anode of an rectifier diode D1 for clamping is connected to the part between the coil L1 and the first resistor R1 closer to the coil L1. An anode of the first Schottky barrier diode SBD1 is grounded at a part 7 at ground potential, and a cathode of the clamping rectifier diode D1 is connected to a positive terminal of a power supply 11. One terminal of a first capacitor C1 for eliminating noises in cooperation with the coil L1 is connected between the first A-D input port 5 of the microcomputer 3 and the coil L1, and another terminal of the first capacitor C1 is grounded at the part 7 at ground potential.

An anode of a second Schottky barrier diode SBD2 for correction and one terminal of a second resistor R2 for correction are connected to a second analog-to-digital conversion input port or second A-D input port 9 of the microcomputer 3. A cathode of the second Schottky barrier diode SBD2 for correction is connected to the positive terminal of the power supply 11. Another terminal of the second resistor R2 for correction is grounded at the part 7 at ground potential.

The first Schottky barrier diode SBD1 for clamping and the second Schottky barrier diode SBD2 for correction used here are identical in specifications and are in accordance with the same leakage current standard. It is desirable to use a product consisting of two or more Schottky barrier diodes manufactured in the same process which is available on the market as a single package. Similarly, the first resistor R1 and the second resistor R2 used here are identical in specifications and resistance.

For example, an insulation detector 13 of the present embodiment having such a voltage detection circuit 1 is used for a DC power supply 11 serving as a power source of an electrically driven vehicle whose driving force is obtained using electrical power. The power supply 11 is a plurality of batteries connected in series or a fuel battery. A positive side main circuit wiring 15a and a negative side main circuit wiring 15b on the sides of positive and negative terminals of the power supply 11 respectively are insulated from the part 7 at ground potential which is, for example, a vehicle body, and the power supply 11 is therefore a non-grounded power supply. The insulation detector 13 is constituted by a first switch S1, a second switch S, a third switch S3, a fourth switch S4, a second capacitor C2, the voltage detection circuit 1 described above, and a switching control circuit, which is not shown, for controlling the opening and closing of each of the switches at preset times.

The microcomputer 3 of the voltage detection circuit 1 of the present embodiment also functions as a calculation section and a determination section for determining the state of insulation in the insulation detector 13. A single microcomputer may serve as a microcomputer forming a part of the voltage detection circuit, a microcomputer constituting the calculation section in the insulation detector, and a microcomputer forming a part of the switching control circuit as in this embodiment, whereas those functions may alternatively be provided by separate microcomputers. The first switch S1, the second switch S2, the third switch S3, and the fourth switch S4 in FIG. 1 are shown in a frame format, the switches are constituted by various components having a switching function such as relays and semiconductor switches.

The first switch S1 and the third switch S3 are connected in series to the positive terminal of the power supply 11 in the order listed which is the order of their closeness to the positive terminal. The second switch S2, the fourth switch S4, and a third resistor R3 are connected in series to the negative terminal of the power supply 11 in the order listed which is the order of their closeness to the negative terminal.

A first diode D1 and a fourth resistor R4 are connected such that they are arranged in series in the order listed from a part between the first switch S1 and the third switch S3 toward a part between the second switch S2 and the fourth switch S4. A second diode D2 and a fifth resistor R5 are connected such that they are arranged in series in the order listed from a part between the fourth resistor R4 and a second capacitor C2 toward a part between the first switch S1 and third switch S3. That is, the first diode D1 and the fourth resistor R4 and the second diode D2 and the fifth resistor R5 are connected in parallel, respectively. A fifth switch S5, and a sixth resistor R6 lower in resistance than the fifth resistor R5 are connected as a bypass unit such that they are arranged in series in the order listed from a part between the second diode D2 and the fifth resistor R5 toward the part 7 at ground potential. The first diode D1 performs rectification in the direction from the positive side to toward the negative side, and the second diode D2 performs rectification in the direction opposite to that of the first diode D1.

A seventh resistor R7 is connected between the third switch S3 and the third resistor R3 in series with the third switch S3 and the third resistor R3. The part 6 under voltage detection is located between the third switch S3 and the seventh resistor R7. The voltage detection circuit 1 is connected to the part 6 under voltage detection. A part between the seventh resistor R7 and the third resistor R3 is grounded at the part 7 at ground potential.

In the present embodiment, a first switching unit which connects the second capacitor C2 to the power supply 11 in series for a first preset time is constituted by the first switch S1, the second switch S2, and the switching control circuit (not shown). A second switching unit which connects the second capacitor C2 between the positive terminal of the power supply 11 and the part 7 at ground potential in series for a second preset time is constituted by the first switch S1, the fourth switch S4, and the switching control circuit (not shown). A third switching unit which connects the second capacitor C2 between the part 7 at ground potential and the negative terminal of the power supply 11 in series for the second preset time is constituted by the second switch S2, the third switch S3, and the switching control circuit (not shown). A fourth Switching unit which detects a voltage across both terminals of the second capacitor C2 through the voltage detection circuit 1 is constituted by the third switch S3, the fourth switch S4, and the switching control circuit which is not shown. For example, the second capacitor C2 used has a relatively great capacity, e.g., several μF, and the first resistor R1 and the second resistor R2 used have a relatively high resistance, e.g., several hundred kΩ.

A description will now be made on operations of the voltage detection circuit having such a configuration and the insulation detector having the voltage detection circuit and areas of the same. Referring to an operation of detecting the state of insulation of the part at ground potential performed by the insulation detector 13, as shown in FIGS. 2 and 3, when the insulation detector 13 starts detecting the state of insulation, the switching control circuit (not shown) closes the first switch S1 and the second switch S2 for a first closing time T1 that is the first preset time (step 101). Specifically, the first switching unit forms a circuit for connecting the second capacitor C2 to the power supply 11 in series without the intervention of the part 7 at ground potential to charge the second capacitor C2 and to increase a voltage VC across the terminals of the second capacitor C2 fir the first closing time T1. The first closing time T1 is a time shorter than a time required for fully charging the second capacitor C2, e.g., a time which is as short as ⅕ to 1/10 of the time required for fully charging the second capacitor C2. The first closing time T1 is chosen in consideration to a tolerance required for measurement of an insulation resistance.

When the first closing time T1 passes at step 101, the first switch S1 and the second switch S2 are opened or shut off. When a predetermined time tw1 shorter than the first closing time T1 passes, the third switch S3 and the second switch S4 are closed (step 103). The fourth switching unit forms a circuit for discharging from the second capacitor C2 including the fifth resistor R5, the seventh resistor R7, and the third resistor R3, and the voltage detection circuit 1 including the microcomputer 3 for detecting the voltage across the terminals of the second capacitor C2 is connected to the discharging circuit. When a predetermined time tw2 shorter than the first closing time T1 passes after the closing of the third switch S3 and the fourth switch S4, the microcomputer 3 reads A-D-converted data or the voltage VC across the terminals of the second capacitor C2 through the first A-D input port 5 (step 105).

At this time, the voltage applied to the first A-D input port 5 of the microcomputer 3 is a voltage which corresponds to the value of the voltage VC across the terminals of the second capacitor C2 and which has dropped by the amount of a loss corresponding to a leakage current at the first Schottky barrier diode SBD1 for clamping, the leakage current depending on the ambient temperature of the insulation detector 13 or the ambient temperature of the voltage detection circuit 1. At step 105, the microcomputer 3 detects a voltage V2 applied to the second A-D input port 9 connected with the second Schottky barrier diode SBD2 for correction and the second resistor R2 for correction and adds the voltage V2 detected at the second A-D input port 9 to a voltage V1 detected at the first A-D input port 5, and the result constitutes a detection voltage V0 of the voltage detection circuit 1 at this time.

The voltage applied to the second A-D input terminal 9 is a voltage corresponding to a leakage current at the second Schottky barrier diode SBD2 for correction which depends on the ambient temperature of the insulation detector 13. The first Schottky barrier diode SBD1 and the second Schottky barrier diode SBD2 are in accordance with the same leakage current standard. The voltage applied to the second A-D input port 9 is substantially equal to a voltage loss attributable to a leakage current at the first Schottky barrier diode SBD1 which depends on the ambient temperature of the insulation detector 13. Therefore, when V0=V1+V2, the detection voltage V0 is a value that reflects a correction for the voltage loss attributable to the leakage current at the first Schottky barrier diode SBD1.

An estimated power supply voltage V0S is calculated from Equation 1 shown below using the corrected detection voltage V0 (step 107).

$$V0S=V0/\{1-\text{EXP}(-T1/C \cdot R4)\} \quad \text{Equation 1}$$

In Equation 1, T1 represents the closing time of the first switch S1 and the second switch S2; C represents the capacity of the second capacitor C2; and R4 represents the resistance of the fourth resistor R4.

After the voltage VC across the terminals of the second capacitor C2 is detected at step 105, the switching control circuit (not shown) closes the fifth switch S5 with the third switch S3 and the fourth switch S4 closed to bypass the fifth resistor R5. Since discharge occurs through the sixth resistor R6 lower in resistance than the fifth resistor R5, the amount of electricity discharged from the second capacitor C2 increases to increase the dropping rate of the voltage VC across the terminals of the second capacitor C2, which allows the time required for the discharge from the second capacitor C2 to be shortened. When a predetermined time td1 shorter than the first closing time T1 passes after the closing of the fifth switch S5, the fifth switch S5 is opened or unmade, and the microcomputer 3 thereafter reads A-D converted data or the voltage VC across the terminals of the second capacitor C2 through the first A-D input port 5 (step 109).

When the voltage VC is identified as 0 V at step 109, the switching control circuit (not shown) opens the third switch S3 and closes the first switch S1 after the predetermined time tw1 passes. The first switch S1 and the fourth switch S4 are closed for a second closing time T2 which is the second preset time (step 111). Specifically, the second switching unit forms a circuit in which the second capacitor C2 is connected in series between the positive terminal of the power supply 11 and the part 7 at ground potential, i.e., a circuit as shown in FIG. 1 in which the positive side circuit wiring 15a, the first switch S1, the first diode D1, the fourth resistor R4, the second capacitor C2, the fourth switch S4, the third resistor R3, the part 7 at ground potential, and a ground resistance Rn on the negative terminal side that is assumed to be located as indicated by a dotted line in FIG. 1, and the negative side main circuit wiring 15b are connected in series to the power supply 11. Thus, the second capacitor C2 is charged for the second closing time T2 to increase the voltage VC across the terminals of the second capacitor C2 in accordance with the value of the ground resistance Rn as shown in FIG. 3. Similarly to the first closing time T1, the second closing time T2 constituting the second preset time is set shorter than the time required for fully charging the second capacitor C2 and longer than the predetermined times tw1, tw2, and td1.

When the second closing time T2 passes at step 111, as shown in FIGS. 2 and 3, the first switch S1 is opened or shut off; the third switch S3 is closed after the predetermined time tw1 passes; and the third switch S3 and the fourth switch S4 are thus closed. That is, the fourth switching unit forms a circuit for discharging from the second capacitor C2 including the second resistor R2, the third resistor R3, and the fourth resistor R4, and the voltage detection circuit 1 including the microcomputer 3 for detecting the voltage across the terminals of the second capacitor C2 is connected to the discharging circuit. In this state, the microcomputer 3 reads A-D-converted data or the voltage VC across the terminals of the second capacitor C2 through the first A-D input port 5 (step 113).

At this time, the voltage applied to the first A-D input port 5 of the microcomputer 3 is a voltage which corresponds to the value of the voltage VC across the terminals of the second capacitor C2 and which has dropped by the amount of a loss corresponding to a leakage current at the first Schottky barrier diode SBD1 for clamping, just as in step 105, the leakage current depending on the ambient temperature of the insulation detector 13 or the ambient temperature of the voltage detection circuit 1. At step 113, the microcomputer 3 adds the voltage V2 detected at the second A-D input port 9 to the voltage V1 detected at the first A/D input port 5 to obtain a detection voltage VCN at the voltage detection circuit 1 at this time. When VCN=V1+V2 as thus described, the detection voltage VCN is a value which reflects a correction of a voltage loss attributable to a leakage current at the first Schottky barrier diode SBD1.

The insulation resistance of the negative terminal side of the power supply 11 to a vehicle body constituting the part 7 at ground potential or the ground resistance Rn on the negative terminal side is calculated using Equation 2 shown below from the detection value VCN (step 115).

$$Rn=-R4-T2/C \cdot \ln(1-VCN/V0s)$$ Equation 2

In Equation 2, T2 represents the closing time of the first switch S1 and the fourth switch S4; C represents the capacity of the second capacitor C2; R4 represents the resistance of the fourth resistor R4; and V0s represents the power supply voltage estimated at step 107.

After the voltage VC across the terminals of the second capacitor C2 is detected at step 115, the switching control circuit (not shown) closes the fifth switch S5 with the third switch S3 and the fourth switch S4 closed to bypass the fifth resistor R5. As a result, the resistance of the fifth resistor R5 is decreased to shorten the time required for discharging the second capacitor C2. When a predetermined time td2 shorter than the second closing time T2 passes after the closing of the fifth switch S5, the fifth switch S5 is opened or unmade, and the microcomputer 3 thereafter reads A-D converted data or the voltage VC across the terminals of the second capacitor C2 through the first A-D input port 5 (step 117).

When the voltage VC is identified as 0 V at step 117, the switching control circuit (not shown) opens the fourth switch S4 and closes the second switch S2 after the predetermined time tw1 passes. The second switch S2 and the third switch S3 are closed for the second closing time T2 which is the second preset time (step 119). Specifically, the third switching unit forms a circuit in which the second capacitor C2 is connected in series between the part 7 at ground potential and the negative terminal of the power supply 11, i.e., a circuit as shown in FIG. 1 in which the positive side circuit wiring 15a, a ground resistance Rp on the positive terminal side assumed to be located as indicated by a dotted line in FIG. 1, the part 7 at ground potential, the seventh resistor R7, the third switch S3, the first diode D1, the fourth resistor R4, the second capacitor C2, the second switch S2, and the negative side main circuit wiring 15b are connected in series to the power supply 11. Thus, the second capacitor C2 is charged for the second closing time T2 to increase the voltage VC across the terminals of the second capacitor C2 in accordance with the value of the ground resistor Rp as shown in FIG. 3.

When the second switch S2 and the third switch S3 are closed, the potential at the part under voltage detection becomes a negative potential. However, since the Schottky diode SBD1 for clamping is connected between the part 6 under voltage detection and the part 7 at ground potential, no excessive negative voltage will be applied to the first A-D input port 5 of the microcomputer 3 to which the part 6 under voltage detection is connected.

When the second closing time T2 passes at step 119, as shown in FIGS. 2 and 3, the second switch S2 is opened or unmade; the fourth switch S4 is closed after the predetermined time tw1 passes; and the third switch S3 and the fourth switch S4 are thus closed. That is, the fourth switching unit forms a circuit for discharging from the second capacitor C2 including the second resistor R2, the third resistor R3, and the fourth resistor R4, and the voltage detection circuit 1 including the microcomputer 3 for detecting the voltage across the terminals of the second capacitor C2 is connected to the discharging circuit. In this state, the microcomputer 3 reads A-D-converted data or the voltage VC across the terminals of the second capacitor C2 through the first A-D input port 5 (step 113).

At this time, the voltage applied to the first A-D input port 5 of the microcomputer 3 is a voltage which corresponds to the value of the voltage VC across the terminals of the second capacitor C2 and which has dropped by the amount of a loss corresponding to a leakage current at the first Schottky barrier diode SBD1 for clamping, just as in steps 105 and 113, the leakage current depending on the ambient temperature of the insulation detector 13 or the ambient temperature of the voltage detection circuit 1. At step 121, the microcomputer 3 adds the voltage V2 detected at the second A-D input port 9 to the voltage V1 detected at the first A/D input port 5 to obtain a detection voltage VCP at the voltage detection circuit 1 at this time. When VCP=V1+V2 as thus described, the detection voltage VCP is a value which reflects a correction of a voltage loss attributable to a leakage current at the first Schottky barrier diode SBD1.

The insulation resistance of the positive terminal side of the power supply 11 to the vehicle body constituting the part 7 at ground potential or the ground resistance Rp on the positive terminal side is calculated using Equation 3 shown below from the detection value VCP (step 123).

$$Rp = -R4 - T2/C \cdot \ln(1 - VCP/V0s) \qquad \text{Equation 3}$$

In Equation 3, T2 represents the closing time of the second switch S2 and the third switch S3; C represents the capacity of the second capacitor C2; R4 represents the resistance of the fourth resistor R4; and V0s represents the power supply voltage estimated at step 107.

After the voltage VC across the terminals of the second capacitor C2 is detected at step 123, the switching control circuit (not shown) closes the fifth switch S5 with the third switch S3 and the fourth switch S4 closed to bypass the fifth resistor R5. As a result, the resistance of the fifth resistor R5 is decreased to shorten the time required for discharging the second capacitor C2. When the predetermined time td2 passes after the closing of the fifth switch S5, the fifth switch S5 is opened or unmade, and the microcomputer 3 thereafter reads A-D converted data or the voltage VC across the terminals of the second capacitor C2 through the first A-D input port 5 (step 125). When the voltage VC is identified as 0 V at step 125, one cycle of insulation state detection is completed. When the state of insulation is to be detected again, the cycle for detecting the state of insulation from step 101 to step 125 is repeated.

The microcomputer 3 determines the state of insulation from values of the ground resistance Rp on the positive terminal side of the power supply 11 and the ground resistance Rn on the negative terminal side obtained by one cycle of detection of the state of insulation or averages of the values of the ground resistance Rp on the positive terminal side and the ground resistance Rn on the negative terminal side obtained by a plurality of cycles of detection of the insulation state. For example, the ground resistance Rp on the positive terminal side of the power supply 11 or an average of the same is compared with a predetermined reference resistance. When the ground resistance Rp is equal to or lower than the reference resistance, it is determined that an insulation failure has occurred.

FIG. 4 shows results of calculations of errors between values of the ground resistance Rp on the positive terminal side and the ground resistance Rn on the negative terminal side measured using the insulation detector 13 of the present embodiment as thus described and actual values of the ground resistance Rp on the positive terminal side and the ground resistance Rn on the negative terminal side on an assumption that the second capacitor C2 used has a predetermined specified capacity and that the fourth resistor R4 used has a predetermined specified resistance. It is assumed that the second capacitor C2 may have a variation of about ±10% in capacity when variations from product to product and temperature changes are taken into consideration and that the fourth resistor R4 may have a variation of about ±2% in resistance when variations from product to product and temperature changes are taken into consideration. In FIG. 4, the term "Vo measuring time" means the first closing time, and FIG. 4 therefore shows errors in measurement which occurred when the first closing time T1 was set at t sec, 2t sec, and 3t sec where t<2t<3t. FIG. 4 is a graph showing results of the calculations in which detection accuracy or detection errors are plotted along the ordinate axis and in which values of the ground resistances are plotted along the abscissa axis.

As apparent from FIG. 4, the degree of a reduction of an error in measurement depends on the setting of the V0 measuring time or first closing time T1. When the first closing time T1 is t sec, a ground resistance is measured with a greater error, the lower the resistance. A ground resistance is measured with a smaller error, the higher the resistance. When the first closing time T1 is 2t, a high ground resistance is measured with a greater error than when the first closing time T1 is t sec, and errors are small when averaged between the ground resistances. When the first closing time T1 is 3t, errors are also small when averaged between the ground resistances, but the errors are greater than those measured when the first closing time T1 is 2t sec.

Therefore, the first closing time T1 is preferably set at t sec when a ground resistance value to determine an insulation failure is a relatively great value, and the first closing time T1 is preferably set at 2t sec when the ground resistance value to determine an insulation failure is set at a relatively small value. As thus described, the first closing time T1 or first preset time is preferably chosen such that it results in small errors in measurement around a ground resistance value for determining an insulation failure. For example, when a ground resistance value for determining an insulation failure is set at R Ω in FIG. 4, it is preferable to select 2t as the first closing time T1.]

As thus described, in the voltage detection circuit 1 of the present embodiment, the first Schottky barrier diode SBD1 for clamping connected to the first A-D input port 5 of the microcomputer 3 and the second Schottky barrier diode SBD2 for correction connected to the second A-D input port 9 of the microcomputer 3 are Schottky barrier diodes according to the same leakage current standard. Thus, a voltage substantially equal to a voltage loss attributable to a leakage current at the first Schottky barrier diode SBD1 for clamping is applied to the second A-D input port 9 of the microcomputer 3 to which the second Schottky barrier diode SBD2 for correction is connected. Since a detection voltage is obtained by adding the voltage applied to the second A-D input port 9 of the microcomputer 3 to the voltage applied to the first A-D input port 5, it is possible to obtain a detection voltage reflecting a correction for any voltage loss attributable to the first Schottky barrier diode SBD1 for clamping. Since the correction of a detection voltage does not involve any calculation and conversion that can introduce an error as thus described, the accuracy of a detection voltage can be improved.

Further, the voltage detection circuit 1 of the present embodiment is provided with the second resistor R2 for correction which is connected to the second A-D input port 9 of the microcomputer 3 at on terminal thereof and grounded at the part 7 at ground potential at another terminal thereof. The second resistor R2 for correction has the same resistance as the first resistor R1 connected to the first A-D input port 5 of the microcomputer 3. Therefore, the accuracy of a detection voltage can be improved even when the first resistor R1 is provided at the first A-D input port 5 of the microcomputer 3, because a voltage substantially equal to a voltage loss attributable to any leakage current at the first Schottky barrier diode SBD1 for clamping is applied to the second A-D input port 9 of the microcomputer 3.

In addition, the insulation detector 13 of the present embodiment has the voltage detection circuit 1 which can improve the accuracy of a detection voltage without any need for calculation and conversion that can introduce an error in correcting a detection voltage. Therefore, the voltage detection circuit has improved accuracy in detecting voltages such as detection voltages V0, VCN, and VCP used for estimating the voltage at the power supply 11 and calculating the ground resistance Rp on the positive terminal side of the power supply 11 and the ground resistance Rn on the negative terminal side thereof, which allows a further improvement in the accuracy of detection of the state of insulation. In addition, advantages including a reduction in calculation time and a reduction in the capacity of storage such as a memory used for such a purpose can be achieved.

While the voltage detection circuit 1 of the present embodiment has been described as having a configuration including the first resistor R1, the coil L, the first capacitor C1, and the second resistor R2, those electrical components may be deleted as occasions allow because the necessity of them depends on the configuration of the circuit on which voltage detection is to be performed. Further, the rectifier diode D1 may also be deleted when occasions allow provided that there is no possibility of application of an excessive positive voltage to the first A-D input port 5 of the microcomputer 3.

The insulation detector 13 of the present embodiment has been described as having a configuration in which the fifth switch S5 and the sixth switch S6 lower in resistance than the fifth resistor R5 are connected in series across a part between the second diode D2 and the fifth resistor R5 and the part 7 at ground potential as a bypass unit including the fifth switch S5. However, the invention is not limited to the configuration of the present embodiment, and a bypass unit may be configured by connecting the fifth switch S5 across the terminals of the fifth resistor R5 in parallel with the fifth resistor R5. A configuration without the bypass unit including the fifth resistor R5 may be employed when there is no need for reducing the time required for one cycle of insulation detection.

In the insulation detector 13 of the present embodiment, the ground resistance Rp on the positive terminal side and the ground resistance Rn on the negative terminal side are separately calculated to allow the position of an insulation failure to be detected. However, when only the occurrence of an insulation failure is to be determined without detecting the position of the insulation failure, another equation may be used to calculate a ground resistance value representing the ground resistance Rp on the positive terminal side and the ground resistance Rn on the negative terminal side based on estimated power supply voltage V0s and detection voltages VCP and VCN.

In the insulation detector 13 of the present embodiment, the microcomputer 3 constituting the calculation section calculates the estimated power supply voltage V0s and the ground resistance Rp on the positive terminal side and the ground resistance Rn on the negative terminal side using Equations 1 and 2. However, in order to shorten the time required for calculating complicated functional equations such as Equations 1 and 2, a power supply voltage data table and a ground resistance data table may be prepared in association with addresses in a memory in the microcomputer 3 serving as the storage to store estimated power supply voltages V0s, ground resistances Rp on the positive terminal side, and ground resistances Rn on the negative terminal side, and the microcomputer 3 serving as the calculation section may calculate addresses associated with each of the data tables. At this time, the microcomputer 3 serving as the calculation section calculates addresses in each of the power supply voltage data table and the ground resistance data table using equation for calculating addresses simpler than Equations 1 and 2 from a value of the voltage VC across the terminals of the second capacitor C2 or the detection voltage V0 detected for estimating the power supply voltage and from values of the voltage VC across the terminals of the second capacitor C2 or detection voltages VCN and VCP detected for obtaining the ground resistance Rp on the positive terminal side and the ground resistance Rn on the negative terminal side. The microcomputer 3 determines the estimated power supply voltage V0s and the ground resistance Rp on the positive terminal side and the ground resistance Rn on the negative terminal side from the respective addresses thus calculated.

The voltage detection circuit employing the invention is not limited to the use in the insulation detector 13 described in the present embodiment, and the circuit may be used in circuits and apparatus for various purposes which perform voltage detection. The voltage detection circuit employing the invention is not limited to the circuit configuration described in the present embodiment, and various circuit configurations are possible as long as there is provided a first switching unit which connects a capacitor to a DC power supply whose wirings at a positive terminal side and a negative terminal side thereof are insulated from a part at ground potential, the capacitor being connected in series for a first preset time; a second switching unit which connects the capacitor between the positive terminal of the power supply and the part at ground potential, the capacitor being connected in series for a second preset time; a third switching unit which connects the capacitor between the part at ground potential and the negative terminal of the power supply, the capacitor being connected in series for the second preset time; and a fourth switching unit which connects the voltage detection circuit for detecting a voltage across terminals of the capacitor after each of the first, second, and third switching units is unmade.

The invention makes it possible to improve the accuracy of a voltage detected by a voltage detection circuit. The invention also makes it possible to improve the accuracy of a voltage detected by a voltage detection circuit in an insulation detector, thereby allowing the detecting accuracy of the state of insulation to be further improved.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2003-033601 filed on Feb. 12, 2003, the contents of which are incorporated herein for reference.

What is claimed is:

1. A voltage detection device, comprising:
   a processor that has a first input port for connecting to a voltage detection object part, and a second input port grounded at a first ground potential part;
   a first Schottky barrier diode that has a cathode connected to a junction of an electric wire between the first input port and the voltage detection object part, and an anode grounded at a second ground potential part; and a second Schottky barrier diode that has an anode connected to a junction of an electric wire between the second input port and a third ground potential part, and a cathode connected to a positive terminal of a power supply, the second Schottky barrier diode being identical to the first Schottky barrier diode in the leakage current standard, wherein when the processor detects a voltage at the voltage detection object part, the processor detects a value obtained by adding a voltage applied to the second input port to a voltage applied to the first input port as the voltage.

2. The voltage detection device as set forth in claim 1, further comprising:

a first resistor that is provided between the first input port and the voltage detection object part; and a second resistor that is provided between the second input port and the third ground potential part, wherein a resistance value of the first resistor is the same as that of the second resistor.

3. An insulation detecting apparatus for a non-grounded power supply, comprising:

a first switching unit that connects a capacitor to a DC power supply in series for a first preset time, the DC power supply having wirings at a positive terminal side and a negative terminal side which are insulated from a ground potential part;

a second switching unit that connects the capacitor so as to be arranged between the positive terminal of the power supply and the ground potential part in series for a second preset time;

a third switching unit that connects the capacitor so as to be arranged between the ground potential part and the negative terminal of the power supply in series for the second preset time;

a voltage detection device that detects a voltage across terminals of the capacitor;

a fourth switching unit that connects the voltage detection device so as to detect the voltage after the first, second, and third switching units are shut off; and a calculation unit that estimates a power supply voltage of the power supply based on the voltage detected by the voltage detection device in a state that the first switching unit is shut off, and that calculates an insulation resistance of the power supply with respect to the ground potential part, based on the estimated power supply voltage of the power supply and each of the voltages detected by the voltage detection device after the second switching unit is shut off and the third switching unit is shut of respectively;

wherein the voltage detection device includes:

a processor that has a first input port for connecting to a voltage detection object part, and a second input port grounded at a first ground potential part;

a first Schottky barrier diode that has a cathode connected to a junction of an electric wire between the first input port and the voltage detection object part, and an anode grounded at a second ground potential part; and a second Schottky barrier diode that has an anode connected to a junction of an electric wire between the second input port and a third ground potential part, and a cathode connected to a positive terminal of a power supply, the second Schottky barrier diode being identical to the first Schottky barrier diode in the leakage current standard; and wherein when the processor detects a voltage at the voltage detection object part, the processor detects a value obtained by adding a voltage applied to the second input port to a voltage applied to the first input port as the voltage.

4. The insulation detecting apparatus as set forth in claim 3, wherein the voltage detection device includes:

a first resistor that is provided between the first input port and the voltage detection object part; and a second resistor that is provided between the second input port and the third ground potential part; and wherein a resistance value of the first resistor is the same as that of the second resistor.

* * * * *